US009146400B1

(12) United States Patent
Lee et al.

(10) Patent No.: US 9,146,400 B1
(45) Date of Patent: Sep. 29, 2015

(54) DISPLAY PANEL TILING USING SEAM-CONCEALING OPTICS

(71) Applicant: Google Inc., Mountain View, CA (US)

(72) Inventors: Johnny Lee, Mountain View, CA (US); Eric Teller, Palo Alto, CA (US); Sergey Brin, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 289 days.

(21) Appl. No.: 13/754,743

(22) Filed: Jan. 30, 2013

Related U.S. Application Data (60) Provisional application No. 61/636,458, filed on Apr. 20, 2012.

(51) Int. Cl.
  *G02B 27/10* (2006.01)
  *G09G 5/00* (2006.01)
  *G02B 27/02* (2006.01)

(52) U.S. Cl.
  CPC .......... *G02B 27/1066* (2013.01); *G02B 27/022* (2013.01)

(58) Field of Classification Search
  USPC .................................... 359/618–620; 345/1.3
  See application file for complete search history.

(56) References Cited

U.S. PATENT DOCUMENTS

| | | | |
|---|---|---|---|
| 5,504,598 A * | 4/1996 | Sprague et al. | 349/57 |
| 5,661,531 A | 8/1997 | Greene et al. | |
| 6,014,232 A | 1/2000 | Clarke | |
| 6,483,482 B1 | 11/2002 | Kim | |
| 6,881,946 B2 | 4/2005 | Cok et al. | |
| 7,145,611 B2 | 12/2006 | Dubin et al. | |
| 7,443,463 B2 | 10/2008 | Chang et al. | |
| 8,643,949 B2 | 2/2014 | Seo et al. | |
| 8,836,896 B2 | 9/2014 | Park et al. | |
| 2002/0008809 A1 | 1/2002 | Babuka et al. | |
| 2002/0080302 A1 | 6/2002 | Dubin et al. | |
| 2003/0071566 A1 | 4/2003 | Kwasnick et al. | |
| 2006/0077544 A1 | 4/2006 | Stark | |
| 2010/0259566 A1* | 10/2010 | Watanabe | 345/690 |
| 2011/0109535 A1* | 5/2011 | Watanabe et al. | 345/87 |

FOREIGN PATENT DOCUMENTS

| | | |
|---|---|---|
| EP | 2306437 A1 | 4/2011 |
| EP | 2312378 A1 | 4/2011 |
| TW | 201030696 A | 8/2010 |
| WO | WO 98/43131 | 10/1998 |
| WO | WO 02/01284 A1 | 1/2002 |
| WO | WO 02/42838 A1 | 5/2002 |

* cited by examiner

*Primary Examiner* — Alicia M Harrington
(74) *Attorney, Agent, or Firm* — Blakely Sokoloff Taylor & Zafman LLP (57) ABSTRACT

Embodiments of a tiled multi-panel display including first and second display panels, each including a substrate with a main portion having a main thickness, an abutting edge with an thickness less than the main thickness, and a taper surface extending between the main portion and the abutting edge, and an array of display pixels disposed in the main portion and extending at least partially around the curved surface. The abutting edge of the first display panel abuts the abutting edge of the second display panel to form a seam, and a seam-concealing optical element is disposed in a void formed by the first and second taper surfaces. Other embodiments are disclosed and claimed.

20 Claims, 8 Drawing Sheets

DISPLAY PANEL TILING USING SEAM-CONCEALING OPTICS

CROSS-REFERENCE TO RELATED APPLICATIONS

This application claims priority under 35 U.S.C. §119(e) to U.S. Provisional Patent Application No. 61/636,458, filed 20 Apr. 2012. The priority provisional application is hereby incorporated by reference in its entirety.

TECHNICAL FIELD

The described embodiments relate generally to tiled displays and in particular, but not exclusively, to tiled multi-panel displays using seam-concealing optical elements.

BACKGROUND

Large wall displays can be prohibitively expensive because the cost to manufacture display panels increases exponentially with display area. This cost increase arises from the increased complexity of large monolithic displays, the decreased yields associated with large displays (a greater number of components must be defect free for large displays), and increased shipping, delivery, and setup costs. Tiling smaller display panels to form larger multi-panel displays can help reduce many of the costs associated with large monolithic displays.

Figure 1A:
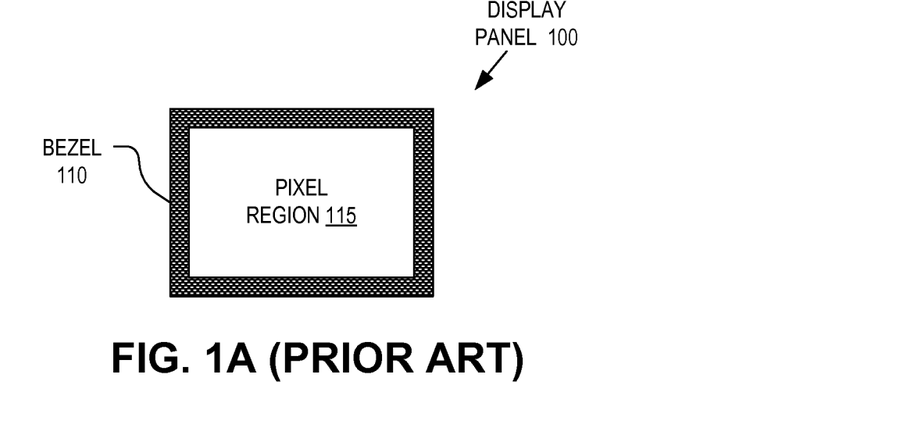
FIGS. 1A-1B illustrate conventional display panel tiling.
Figure 1B:
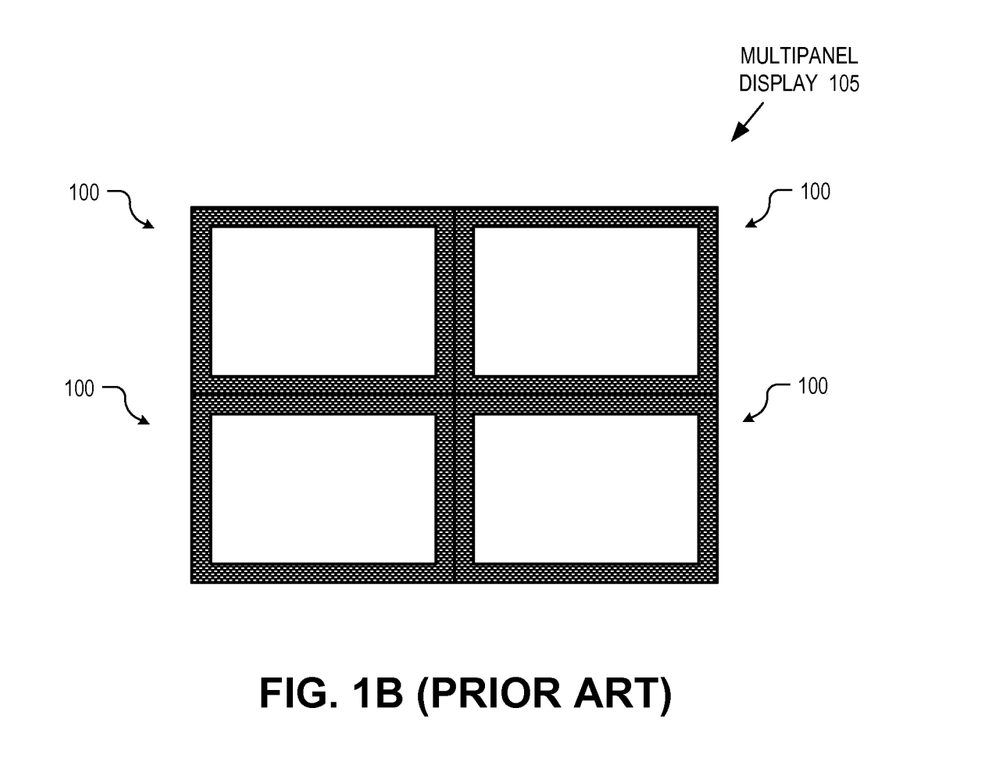

FIGS. 1A-1B illustrate how tiling multiple smaller, less expensive display panels 100 together can achieve a large multi-panel display 105 that can be used as a large wall display. The individual images displayed by each display panel 100 can constitute a sub-portion of the larger overall composite image collectively displayed by multi-panel display 105. Multi-panel display 105 can reduce costs, but visually it has a major drawback. Each display panel 100 includes a bezel 110 around its periphery that houses pixel region 115 in which the display pixels are disposed. Manufacturers have recently reduced the thickness of bezel 110 considerably, to less than 2 mm, but even these thin bezels are very noticeable to the naked eye, meaning that they distract the viewer and otherwise detract from the overall visual experience.

Various other approaches for obtaining seamless displays include display lensing, blended projection, stackable display cubes, and LED tiles. Display lensing places a single contiguous lens in front of each display panel 100 to present a fused, borderless image in a particular "sweet spot." However, the viewing angle is relative narrow and image distortion along continuous lines still occurs. Blended projection uses software stitching and mechanical mounting of traditional projection screens. Currently, blended projection uses relatively low cost hardware and is a good option for non-planar surfaces. However, there are significant physical constraints on usage and installation and requires regular maintenance and sophisticated calibration. Stackable display cubes are a rear projection technology. Each display cube is relatively deep and the seams between adjacent cubes are easily visible. LED tiles are arrays of discrete RGB light emitting diodes ("LED"). LED tiles can have virtually invisible seams because the seams run between pixels. However, LED tiles are expensive and have large pixel pitches (e.g., 2 to 4 mm) that result in low resolution images.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments are described of an apparatus, system and method for tiled multi-panel displays using seam-concealing optics. Numerous details are described to provide a thorough understanding of embodiments of the invention, but one skilled in the relevant art will recognize that the invention can be practiced without one or more of the described details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one described embodiment. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 2A:
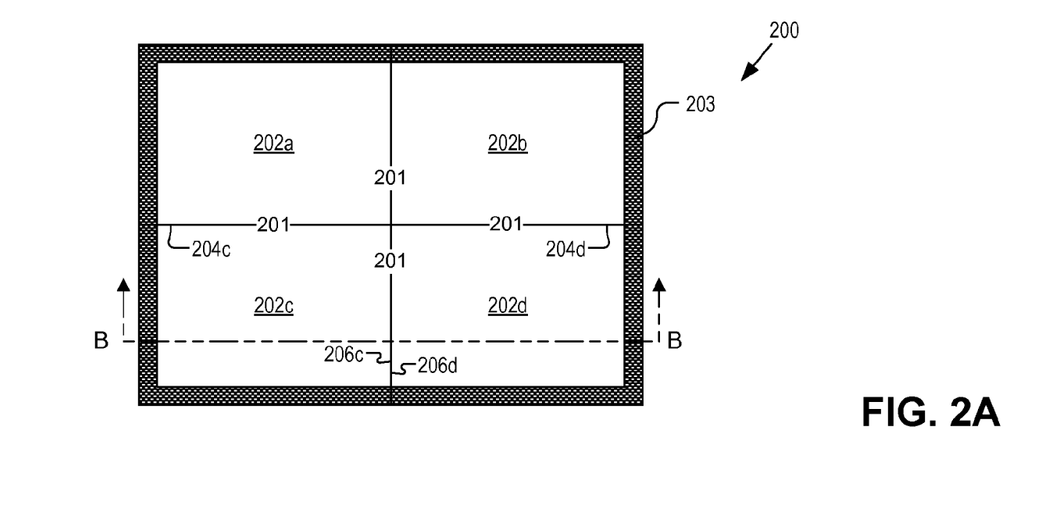
FIG. 2A is a plan view of an embodiment of a tiled multi-panel display.
Figure 2B:
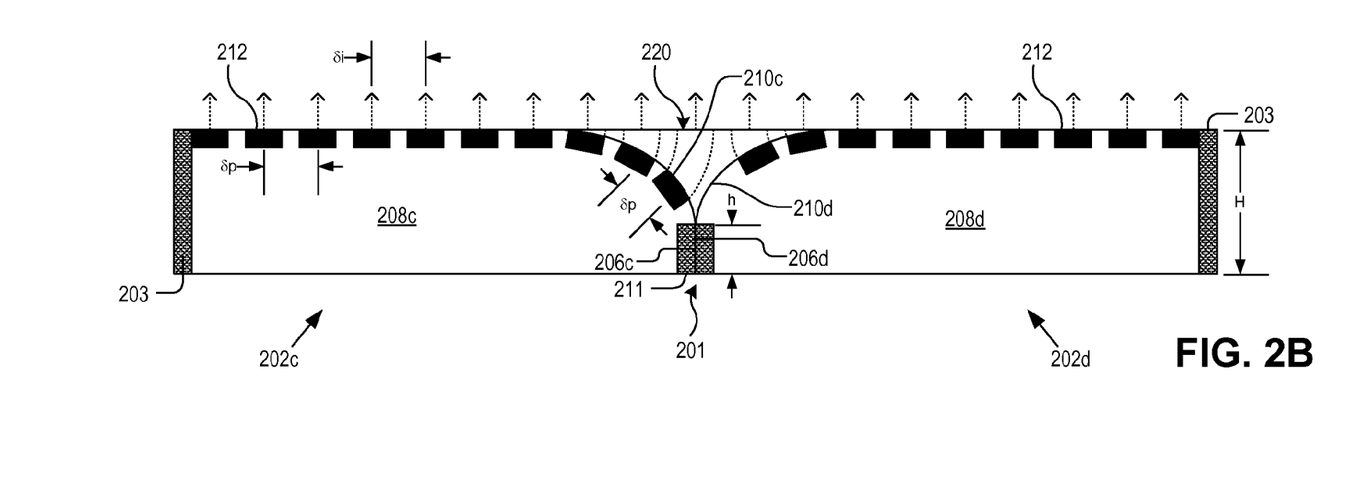
FIG. 2B is a cross sectional view of the embodiment of a tiled multi-panel display of FIG. 2A, taken substantially along line B-B.

FIGS. 2A-2B together illustrate embodiments of a tiled multi-panel display 200; FIG. 2A is a plan view, FIG. 2B a cross-sectional view. Tiled multi-panel display 200 uses seam-concealing optical elements and individual display panels with edge-wrapped display pixels. As shown in FIG. 2A, tiled multi-panel display 200 includes four individual display panels 202a-202d, each including a bezel 203 around at least two edges. The illustrated embodiment of tiled multi-panel display 200 includes four individual display panels, but other embodiments of tiled multi-panel displays can include a greater or lesser number of individual display panels. Tiled multi-panel display 200 can be rigid in one embodiment, but can be flexible in other embodiments. Moreover, tiled multi-panel display 200 can be planar in one embodiment but curved in others.

Each individual display panel 202 includes two abutting edges 204 and 206 along which the display panel abuts two other display panels to form seams 201: display panel 202d includes abutting edge 204d along which it abuts display panel 202b and abutting edge 206d along which it abuts display panel 202c. Abutting edges 206c and 206d abut to form seam 201 between display panels 202c and 202d and, similarly, other abutting edges will form seams when abutted. In a tiled multi-panel display with a different number of individual display panels than shown, each panel will have a different number of abutting edges than shown, and each individual display panel need not have the same number of abutting edges.

FIG. 2B illustrates a cross-section of tiled multi-panel display 200, taken substantially along section line B-B in FIG. 2A, that illustrates the tiling of individual display panels 202c and 202d. Display panels 202c and 202d each include a substrate 208 with a main portion of thickness H. Substrate 208 can be rigid in one embodiment, but can be flexible in other embodiments. Display panel 202c includes an abutting edge 206c, and display panel 202d includes an abutting edge 206d. Display panels 202c and 202d abut each other along these abutting edges 206. In each individual display panel 202, the abutting edge 206 has a thickness h, which in the illustrated embodiment is less than the thickness H of the main part of the substrate such that the display panel tapers at the edges. In the illustrated embodiment, each individual display panel 202 also includes a small bezel 211 along its abutting edges, although this bezel is hidden in the plan view. Other embodiments can of course omit bezel 211 from the abutting edges.

In each individual display panel 202, a taper surface extends between the thicker main portion of the substrate 208 and the thinner abutting edge 206 of the display panel. In the illustrated embodiment the taper surfaces that extend between the main portion of each display panel and its abutting edge are curved surfaces 210c and 210d: display panel 202c includes curved surface 210c near and along abutting edge 206c, display panel 202d includes curved surface 210d near and along abutting edge 206d, and so on. In other embodiments, the taper surfaces need not be curved but can instead be planar or substantially planar surfaces; compound planar or substantially planar surfaces including multiple planar facets positioned at different angles; combinations of planar and curved surfaces; and/or compound curved surfaces having different curvatures in different places.

Each display panel 202 includes an array of pixels 212, and in each individual display panel at least some of the pixels in each array are positioned along curved surfaces 210. In the illustrated embodiment, the pixel pitch, as measured along the surface of the display panel and along the taper surface, is substantially constant—that is, in each display panel the pixel pitch $\delta p$ is the same in the main portion of the substrate 208 as it is along curved surfaces 210. In other embodiments, however the pixel pitch $\delta p$ could vary in different parts of the display panel.

Seam-concealing optical element 220 is positioned on tiled multi-panel display 200 along seams 201, in the voids created by curved surfaces 210c and 210d. Optical element 220 substantially conforms to the shape of the taper surface; in this embodiment, the optical element conforms to the shapes of curved surfaces 210 and results in a tiled multi-panel display 200 with a substantially flat surface. When positioned on seams 201 of tiled multi-panel display 200, seam-concealing optical element 220 guides the lights from pixels along curved surfaces 210 so that the light from the pixels is directed toward the user, and the user perceives a uniform pixel pitch $\delta i$. As a result, seam-concealing optical element 220 conceals seams 201 so they cannot be seen by the viewer of the display.

Figure 3A:
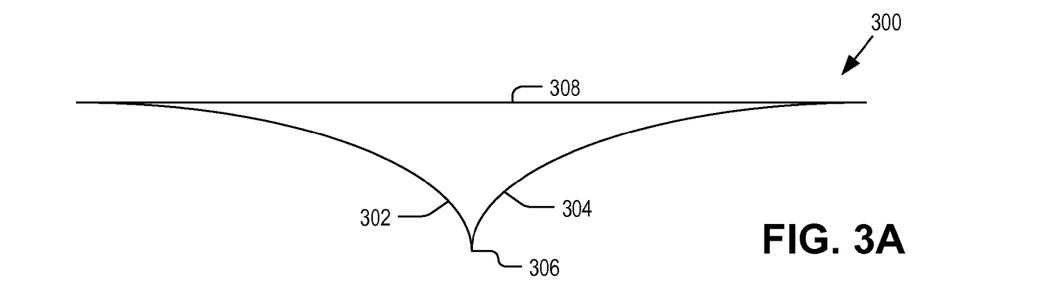
FIGS. 3A-3D are cross-sectional views of embodiments of edge-concealing optics that can be used with the tiled multi-panel display of FIGS. 2A-2B.

FIGS. 3A-3D illustrate embodiments of seam-concealing optical elements that can be used together with the tiled multi-panel display of FIGS. 2A-2B. FIG. 3A illustrates seam-concealing optical element 300. Seam-concealing optical element 300 includes mating surfaces 302 and 304 joined at an apex 306. When seam-concealing optical element 300 is positioned on tiled multi-panel display 200, each mating surfaces 302 and 304 substantially conforms to, and mates with, one of the taper surfaces that form a void between individual display panels 202. The illustrated embodiment shows curved mating surfaces 302 and 304 that mate with curved surfaces 210c and 210d, but in embodiments where the taper surface is of a different shape mating surfaces 302 and 304 will have different shapes that corresponds to the shape of the taper surface. Apex 306 is positioned at the apex formed by curved surfaces 210, which substantially coincides with the seams 201 between individual display panels 202. Substantially planar surface 308 joins mating surfaces 302 and 304 such that the substantially planar surface will coincide with the surfaces of the display panels, resulting in a tiled multi-panel display with a substantially flat surface.

In the illustrated embodiment, seam-concealing optical element 300 is single piece made out of an optically transparent material. In one embodiment, seam-concealing optical element 300 can be manufactured beforehand as a single rigid piece using optically transparent materials such as glass, polycarbonate, optically transparent high-index plastics such as CR39, optical grade acrylic, etc. In other embodiments, seam-concealing optical element 300 can be flexible and, in still other embodiments, can initially be a liquid, gel, paste or other substance that can be dispensed into the void formed by curved surfaces 210c and 210d and later harden to form the seam-concealing optical element, much like spackle, caulking or grout are applied to common household tiles. In one such embodiment, for example, seam-concealing optical element 300 can be made using optically transparent adhesives.

Figure 3B:
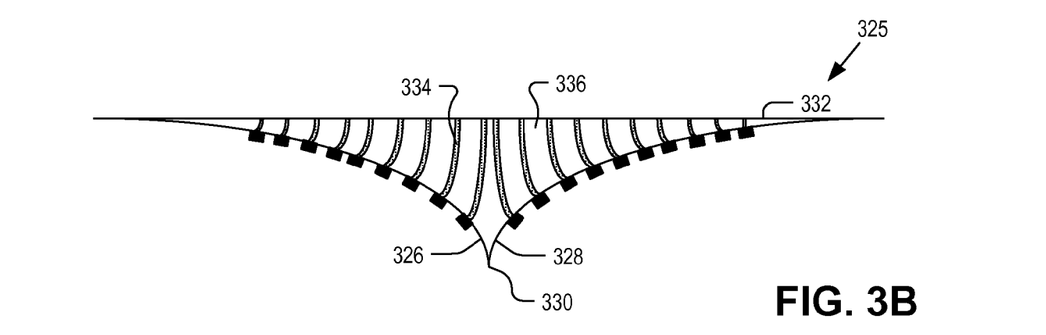

FIG. 3B illustrates an embodiment of a seam-concealing optical element 325. Seam concealing optical element 325 is similar in shape to seam-concealing optical element 300: it includes mating surfaces 326 and 328 joined at an apex 330, as well as a substantially planar surface 332. Seam-concealing optical element 325 include a plurality of waveguides 334 embedded in a matrix 336. Each waveguide 334 is optically coupled to one or more pixels and extends from one of mating surfaces 326 or 328 to the substantially planar surface 332. In the illustrated embodiment each pixel is optically coupled to a corresponding waveguide, resulting in a one-to-one correspondence between pixels and waveguides. In other embodiments, the pixels and waveguides can have different correspondences. For example, more than one pixel can be optically coupled to each waveguide, resulting in a many-to-one correspondence between pixels and waveguides. In one embodiment, waveguides 334 can be optical fibers, but in other embodiments other types of waveguides can be used. Matrix 336 binds the waveguides 334 together and holds them in place, and can be any kind of opaque, transparent or translucent material.

Figure 3C:
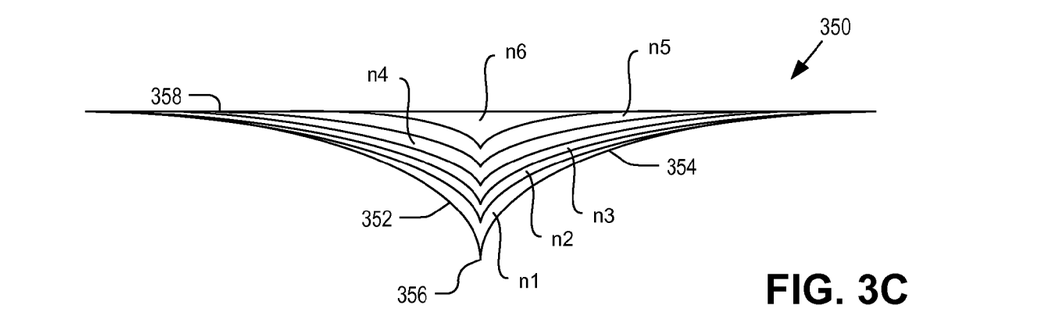

FIG. 3C illustrates another embodiment of a seam-concealing optical element 350. Seam-concealing optical element 350 is similar in most respects to seam-concealing optical element 300: it includes mating surfaces 352 and 354 joined at apex 330, and a substantially planar surface 358 joints mating surfaces 352 and 354. The primary difference is that seam-concealing optical element 350 includes a refractive-index gradient. In the illustrated embodiment, seam-concealing optical element 350 includes five regions, each with a different refractive index: a first region with refractive index n1 at the mating surfaces, regions with diffractive indices n2-n4, and a region of refractive index n5 at the substantially planar surface. In one embodiment, n1 is the largest index of refraction and n5 the smallest, such that the index of refraction is highest near the pixels and decreases with distance from the pixels, but of course this could be different in other embodiments. In one embodiment, all the refractive indices can be different, such that no two are the same, but other embodiments can include regions with similar or equal refractive indices. In still other embodiments a different number of regions with different refractive indices can be used, and other spatial configurations that result in other types of refractive index gradients can also be used. Seam-concealing optical element 350 could be formed, for example, by building up materials of different refractive index into the required shape.

Figure 3D:
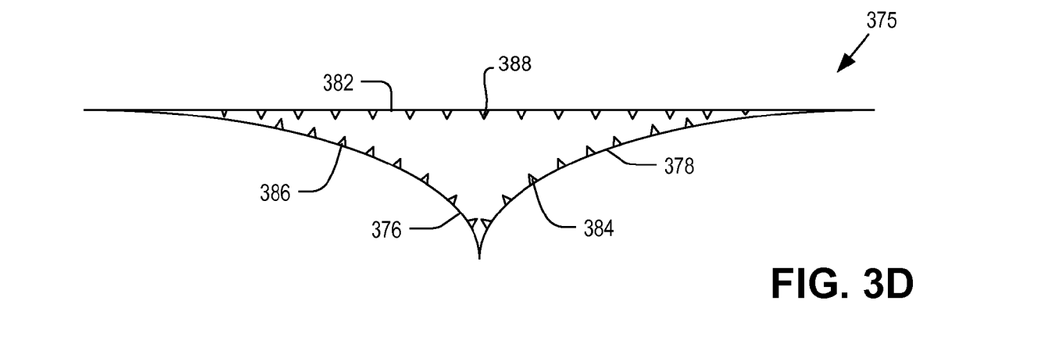

FIG. 3D illustrates another embodiment of a seam-concealing optical element 375. Seam-concealing optical element 375 is similar in most respects the seam-concealing optical element 300: it includes mating surfaces 376 and 378 joined an apex 330, with a substantially planar surface 358 jointing mating surfaces 376 and 378. The primary difference is that seam-concealing optical element 375 includes optical structures to help steer the light output by the pixels. In the illustrated embodiment, seam-concealing optical element 375 includes optical structures 384 in mating surface 376, optical structures 386 in mating surface 378, and optical structures 388 on the substantially planar surface 382. In different embodiments, optical structures 384, 386, and 388 can be diffractive, refractive, or reflective; in one embodiment, for example, the optical structures can be diffraction gratings. In other embodiments, the structures on each surface 376, 378 and 382 need not be of the same construction or type. In still other embodiments seam-concealing optical element 375 can have optical structures on less than all surfaces; for example, another embodiment might include optical structures on substantially planar surface 382 but not on mating surfaces 376 or 378.

Figure 4A:
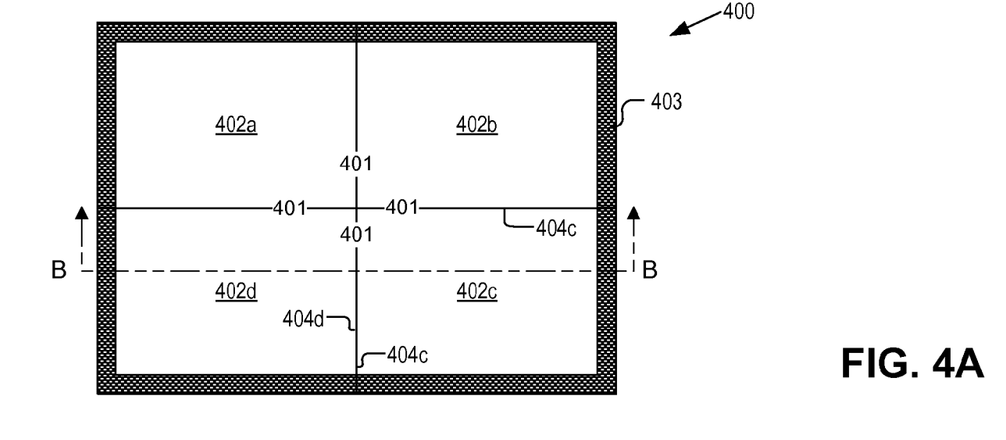
FIG. 4A is a plan view of another embodiment of a tiled multi-panel display.
Figure 4B:
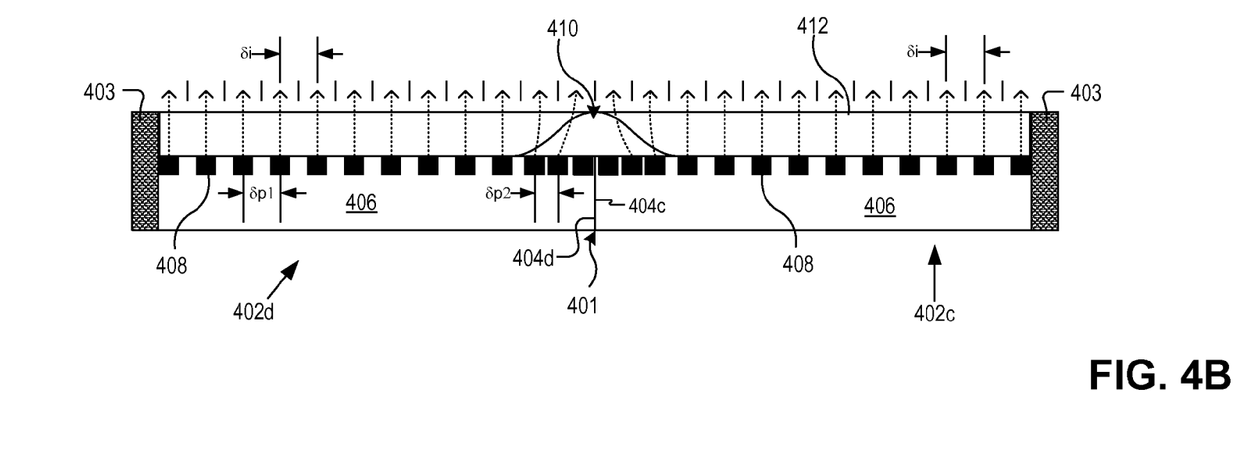
FIG. 4B is a cross sectional view of the tiled multi-panel display of FIG. 4A, taken substantially along line B-B.

FIGS. 4A-4B illustrate another embodiment of a tiled multi-panel display 400. FIG. 4A is a plan view, FIG. 4B a cross-sectional view substantially along line B-B in FIG. 4A. As shown in FIG. 4A, tiled multi-panel display 200 includes four individual display panels 402a-402d, each including a bezel 403 around at least two edges. The illustrated embodiment of tiled multi-panel display 400 includes four individual display panels, but other embodiments of tiled multi-panel displays can include a greater or lesser number of individual display panels. Tiled multi-panel display 400 can be rigid in one embodiment, but can be flexible in other embodiments. Moreover, tiled multi-panel display 400 can be planar in one embodiment but curved in others.

Each individual display panel 402 includes two abutting edges 404 along which the display panel abuts two other display panels to form seams 401; for example, display panel 402c includes one abutting edge 404c along which it abuts display panel 402b and another abutting edge 404c along which it abuts display panel 402s. Abutting edges 404 abut corresponding abutting edges from neighboring display panels to form seams 401. In a tiled multi-panel display with a different number of individual display panels than shown, each panel can have a different number of abutting edges than shown, and each individual display panel need not have the same number of abutting edges.

FIG. 4B illustrates a cross-section of tiled multi-panel display 400 showing how display panel 402c is tiled with display panel 402d along abutting edges 404c and 404d to form seam 401. Each display panel 402 includes a substrate 406 which can be rigid in one embodiment but flexible in other embodiments. Each individual display panel 402 includes an array of pixels 408 formed on one surface. In the illustrated embodiment, the pixel pitch δp1 is a substantially constant over most of the pixel array, but changes to a different value δp2 near abutting edges 404. In the illustrated embodiment, pixel pitch δp2 is smaller than δp1, meaning that the edge pixels (those pixels at or near the abutting edges) are closer together (i.e., have a higher linear density). In other embodiments, however, pixel pitch δp2 can be the same as δp1, in which case the pixels can have uniform spacing throughout the array of pixels.

Seam-concealing optical element 410 is positioned so that it straddles seam 401 created by abutting edges 404d and 404c. Optical element 410 is optically coupled to the edge pixels—that is, the pixels at or near abutting edges 404. When positioned on tiled multi-panel display 400, optical element 410 steers or guides the light output from the edge pixels so that when a viewer looks at the tiled multi-panel display, he or she perceives an image in which the pixels appear spaced apart uniformly a distance δi. An optically transparent planarization layer 412 can be added after the seam-concealing optical element 410 is in position to give the resulting tiled multi-panel display 400 a flush flat surface, rather than a flat surface with bumps along the seams. Planarization layer 412 also protects both seam-concealing optical element 410 and display pixels 408. Seam-concealing optical element 410 facilitates larger tiled multi-panel displays fabricated from smaller less expensive display panels while concealing the inter-panel seams 401.

Figure 5A:
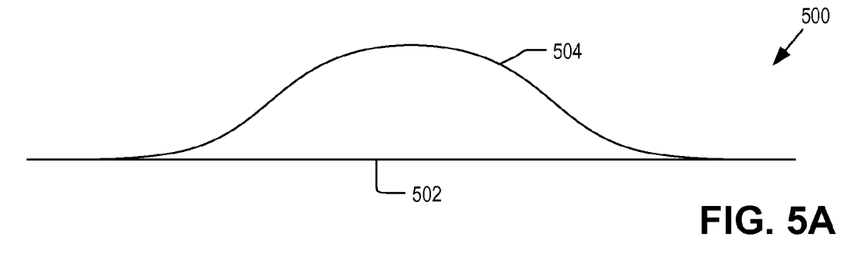
FIGS. 5A-5D are cross-sectional views of embodiments of edge-concealing optics that can be used with the tiled multi-panel display of FIGS. 4A-4B.

FIGS. 5A-5D illustrate embodiments of seam-concealing optical element that can be used with tiled multi-panel display 400. FIG. 5A illustrates an embodiment of seam-concealing optical element 500. Optical element 500 includes a mating surface 502 that, when positioned over seams 401, substantially conform to and mate with the surfaces of display panels 202. A curved surface 504 joins mating surface 502, bounds the optical element, and gives the optical element its optical power. In the illustrated embodiment, optical element 500 is made of a single optically transparent material. In one embodiment, seam-concealing optical element 500 can be a rigid single-piece unit made beforehand from an optically transparent material such as glass, polycarbonate, optically transparent high-index plastics such as CR39, optical grade acrylic, etc.

Figure 5B:
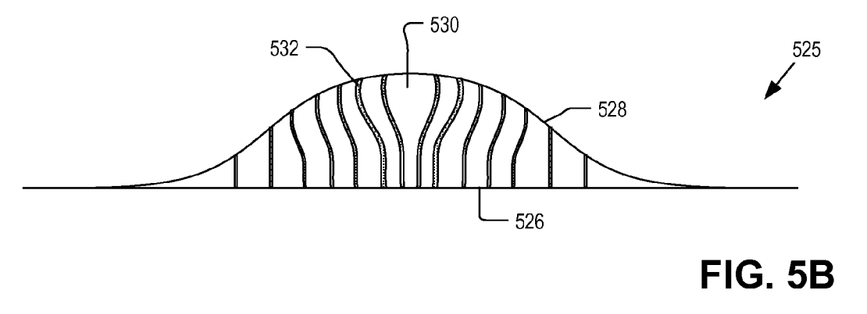

FIG. 5B illustrates an embodiment of seam-concealing optical element 525. Seam-concealing optical element 525 is in most respects similar in shape to seam-concealing optical element 500: it includes, and is bounded by, mating surface 526 and curved surface 528. The primary difference is that optical element 525 includes a plurality of waveguides 532 embedded in a matrix 530. When seam-concealing optical element 525 is put in place on tiled multi-panel display 400, waveguides 532 are optically coupled to pixels and extend from mating surface 526 to curved surface 528. In the illustrated embodiment, each pixel is optically coupled to a corresponding waveguide, so that there is a one-to-one correspondence between pixels and waveguides. In other embodiments, the pixels and waveguides can have different correspondences; for example, more than one pixel can be optically coupled to each waveguide, so that there is a many-to-one correspondence between pixels and waveguides. In one embodiment, waveguides 334 can be optical fibers, but in other embodiments other types of waveguides can be used.

Matrix 530 binds the waveguides 532 together and holds them in place, and can be any kind of opaque, transparent or translucent material.

Figure 5C:
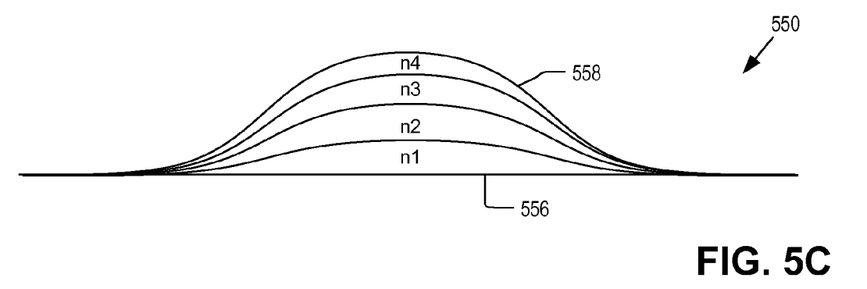

FIG. 5C illustrates another embodiment of seam-concealing optical element 550. Seam-concealing optical element 550 is similar in shape to seam-concealing optical element 500: it includes, and is bounded by, mating surface 556 and curved surface 558. The primary difference is that seam-concealing optical element 550 includes a refractive-index gradient. In the illustrated embodiment, seam-concealing optical element 550 includes five regions, each with a different refractive index: a first region with refractive index n1, regions with diffractive indices n2-n4, and a region of refractive index n5 at the substantially planar surface. In one embodiment, n1 is the largest index of refraction and n5 the smallest, such that the index of refraction is highest near the pixels and decreases with distance from the pixels, but of course this could be different in other embodiments. In one embodiment, all the refractive indices can be different, such that no two are the same, but other embodiments can include regions with similar or equal refractive indices. In still other embodiments a different number of regions with different refractive indices can be used, and other spatial configurations that result in other types of refractive index gradients can also be used. Seam-concealing optical element 550 could be formed, for example, by building up materials of different refractive index into the required shape.

Figure 5D:
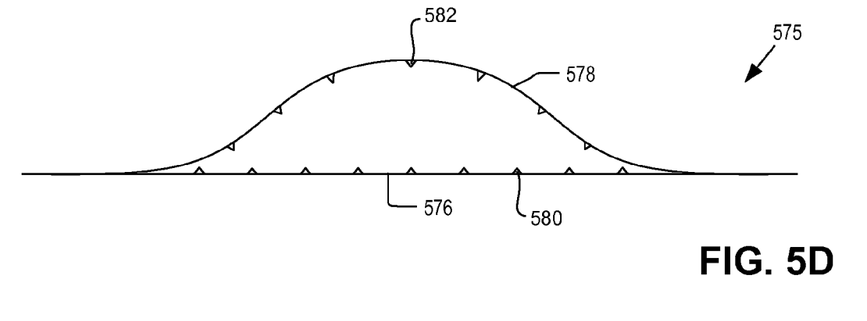

FIG. 5D illustrates another embodiment of seam-concealing optical element 575. Seam-concealing optical element 575 is similar in most respects the seam-concealing optical element 500: it includes, and is bounded by, mating surface 576 and curved surface 578. The primary difference between seam-concealing optical element 575 and seam-concealing optical element 500 is that seam-concealing optical element 575 includes optical structures to help steer the light output by the pixels. In the illustrated embodiment, seam-concealing optical element 575 includes optical structures 580 in mating surface 576 and optical structures 582 in curved surface 578. In different embodiments, optical structures 580 and 582 can be diffractive, refractive, or reflective; in one embodiment, for example, the optical structures can be diffraction gratings. In other embodiments, the structures on or in each surface 576 and 578 need not be of the same construction or type. In still other embodiments seam-concealing optical element 575 can have optical structures on less than all surfaces; for example, another embodiment might include optical structures on mating surface 576 but not on curved surfaces 578.

Figure 6A:
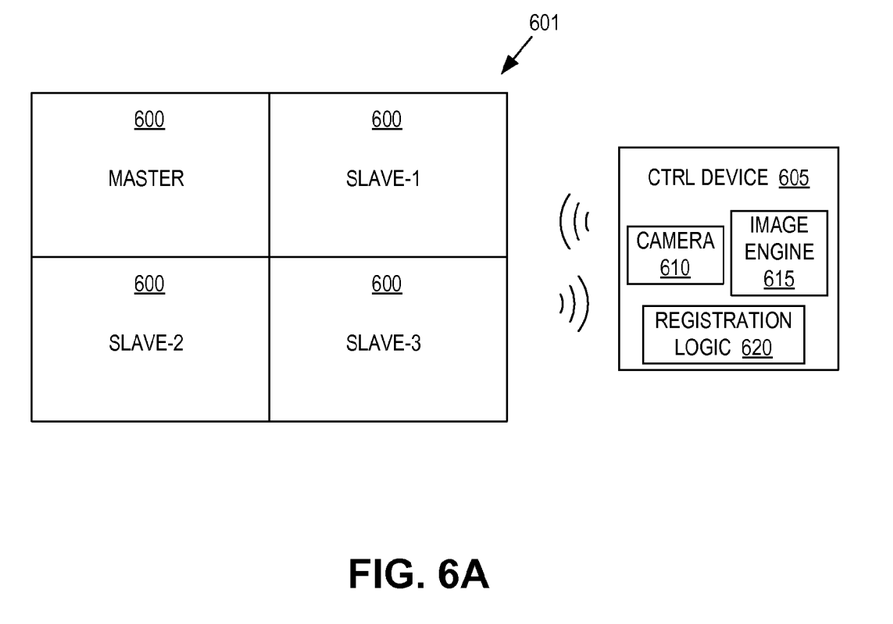
FIGS. 6A-6B illustrate embodiments of communication protocols for displaying a composite image across multiple tiles of a multi-panel display.
Figure 6B:
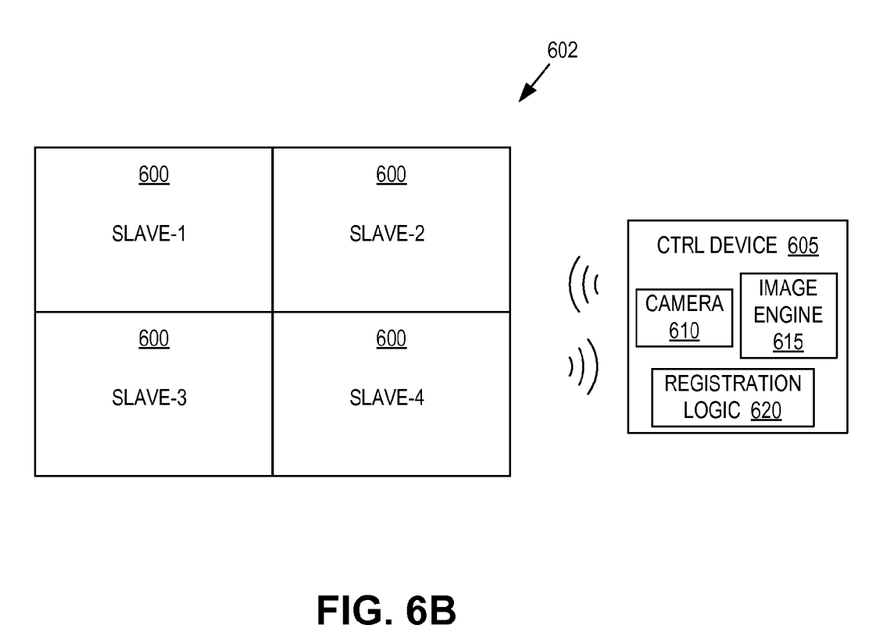

FIGS. 6A-6B illustrate embodiments of communication protocols for displaying a composite image across multiple display panels of a tiled multi-panel display 601. Tiled multi-panel display 601 can be any of the tiled multi-panel displays described herein. FIG. 6A illustrates a technique where one display panel 600 operates as a master and the remaining display panels 600 operate as slaves that communicate with the master. The master device can be identical to the other slave devices, but merely designated as a master during operation. For example, the master device can be the first display panel 600 logically added to the multi-panel display 601. As new display panels 600 are added or existing display panels 600 removed, the master display panel 600 can be responsible tracking and assigning display statuses and roles. In another embodiment, the master device can include additional interface electronics (e.g., wireless transceiver) not included in the other slave display panels 600 for communicating with a control device 605. The control device 605 can communicate display images and control information with the master display panel 600, which then relays the appropriate portions of the display images to the respective slave display panels 600. FIG. 6B illustrates a more distributed protocol where all display panels 600 are identical and operate as slave devices controlled directly by control device 605. Various registration markers can be used to identify and distinguish the various display panels 600. For example, magnetic bits, RFID, optical markers, active links, or various bus interfaces and signaling protocols can be used.

The illustrated embodiment of control device 605 includes a camera 610, an image engine 615, and registration logic 620. In one embodiment, control device 605 can be implemented with a smart phone having a general purpose processor, a built in camera, and wireless interface electronics (e.g., WiFi or Bluetooth transceivers). The wireless interface electronics can be used to stream the composite image to display panels 600. Operation of control device 605 to set up and configure multi-panel displays 601 or 602 is discussed in further detail in connection with FIG. 8.

Figure 7A:
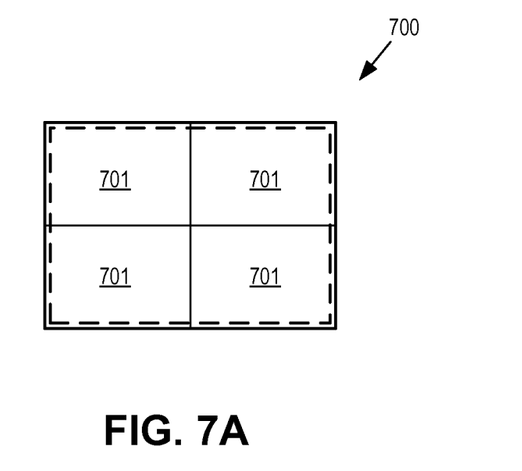
FIGS. 7A-7C illustrate embodiments of techniques for implementing intelligent reformatting/reconfiguration of a display image when an individual display tile is added to or removed from a multi-panel display.
Figure 7B:
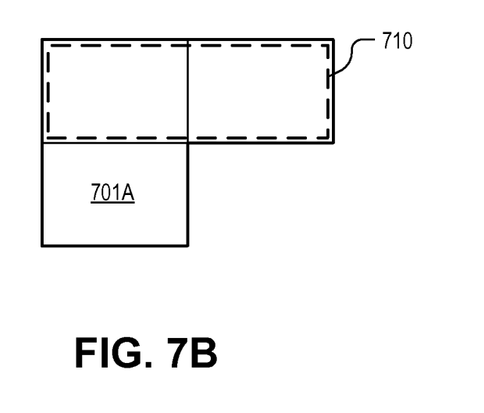
Figure 7C:
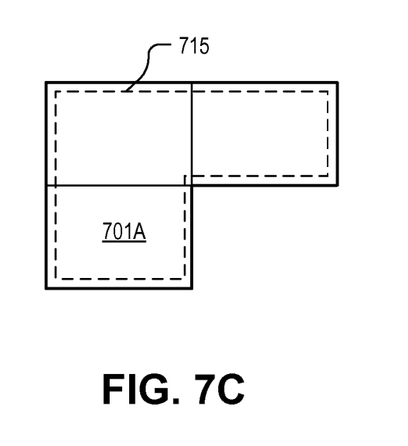

FIGS. 7A-7C illustrate embodiments of techniques for implementing intelligent reformatting/reconfiguration of a display image when an individual display tile is added or removed from a multi-panel display 700. Tiled multi-panel display 700 can be any of the tiled multi-panel displays described herein. When panels are added to or removed from multi-panel display 700, the remaining display panels 701 can be intelligently reconfigured to effectively use the resulting display area. Intelligent reconfiguration can include adjusting image resolution or switching between a complex display interface for large composite display areas, and a simplified display interface for small composite displays (i.e., when the display area rises above or drops below a threshold size).

FIGS. 7B-7C illustrate configuration options when the addition or removal of a display panel 701 results in an irregularly-shaped display area. In FIG. 7B, the display panel 701A forming the irregular shape is unused and the display image reverts to the largest available rectangular shaped area 710. In FIG. 7C, display panel 701A is used and the display image follows the irregular shaped area 715.

Figure 8:
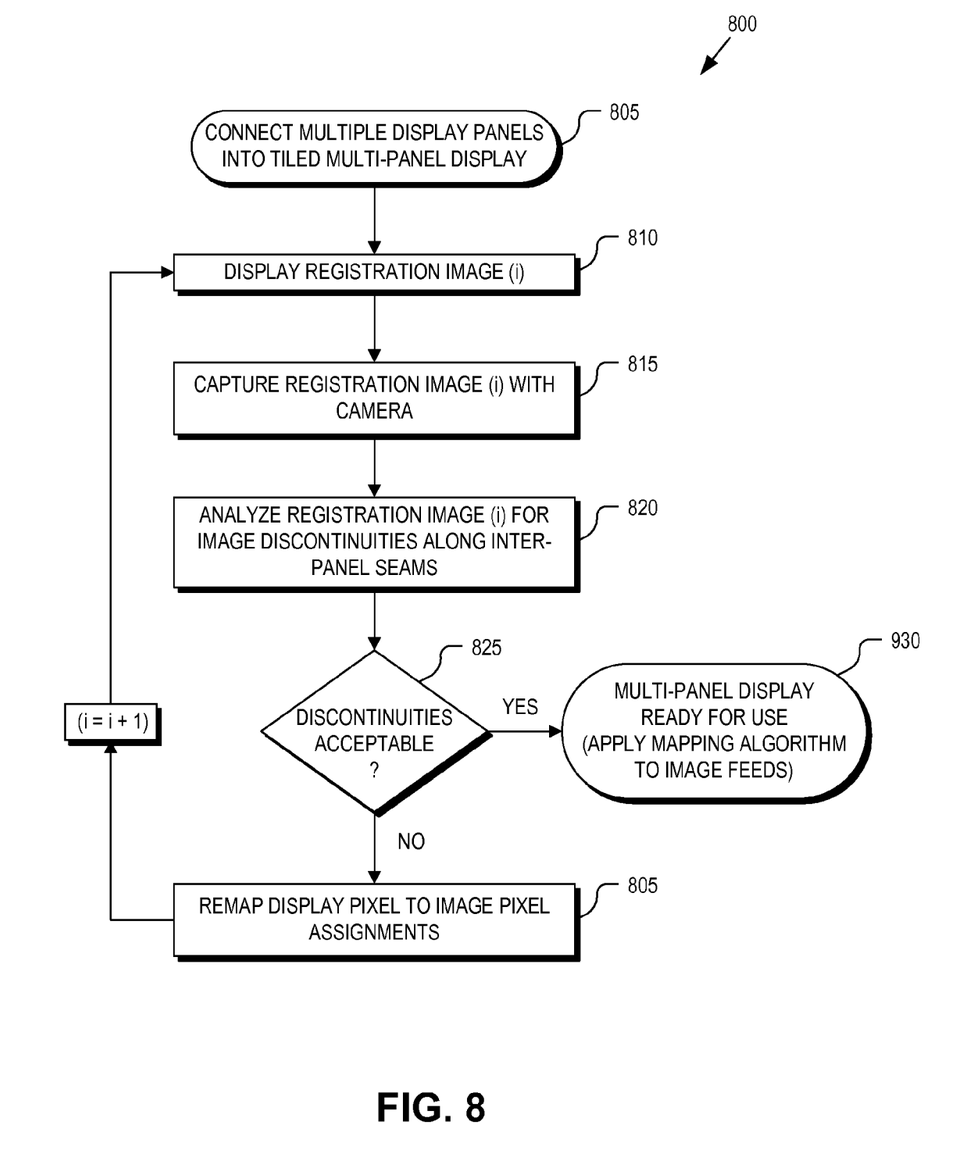
FIG. 8 illustrates an embodiment of a process for image registration to cure misalignments between connected display tiles of a multi-panel display.

FIG. 8 illustrates an embodiment of a process 800 for image registration to cure misalignments between display tiles of a multi-panel display. Process 800 is described with reference to FIG. 7A. The order in which some or all of the process blocks appear in process 800 should not be deemed limiting. Rather, one of ordinary skill in the art having the benefit of the present disclosure will understand that some of the process blocks can be executed in a variety of orders not illustrated, or even in parallel.

When coupling two or more display panels 600 together, perfect physical alignment cannot be achieved, or the display panel can include intentionally randomized pixels that do not perfectly align. Process 800 identifies misalignments or image discontinuities along the seams of a tiled multi-panel display (or within an interior region of the display panel) and remaps display pixel to image pixel assignments to cure the defects.

In a process block 805, two or more display panels 600 are coupled together to form a tiled multi-panel display 601. As previously stated, this coupling can result in one or more image discontinuities along the inter-panel seams. To cure these defects, image engine 615 generates an initial registration image i (e.g., i=1) for transmission to display panels 600. In one embodiment, registration image i is an alternating high contrast image (e.g., black and white checkerboard image) that provides several identifiable marks along the seam edges of each display panel 600 or displays a full screen image that provides enough information to recover the full position and orientation of each panel relative to one another.

In a process block 815, camera 610 is used to capture registration image i output from multi-panel display 601. The captured registration image i is then analyzed by registration logic 620 to identify any misalignment between panels (process block 820). If the misalignment is determined to be unacceptable (decision block 825), then registration logic 620 adjusts the display pixel to image pixel mapping in an attempt to cure the discontinuities or at least reduce the number of image discontinuities. With the pixel assignments remapped, process 800 loops back to process block 810 and can iterate by redisplaying a revised registration image i. The registration iterations can continue until the alignment is determined to be within acceptable limits (decision block 825), at which time multi-panel display 601 is ready for use. Alternatively, this software alignment can be computed from a single calibration image. The remapped display pixel to image pixel assignments are maintained and used for all image feeds until the next recalibration cycle.

In some embodiments, the image registration technique described for FIG. 9 can further be used to smooth out other image discontinuities between the tiled panels than just physical misalignment of the display panels and their fibers. For example, the image registration technique can be used to adjust brightness, color temperature, etc. between the display panels to achieve uniform image characteristics and avoid perceived image characteristic boundaries between the tiled panels. Feedback from the displayed registration images can be used to adjust and smooth these differences. The image registration technique can even be used to smooth differences between individual pixels within a given display panel, if the underlying display permits such pixel-to-pixel adjustments.

The processes explained above are described in terms of computer software and hardware. The techniques described can constitute machine-executable instructions embodied within a tangible or non-transitory machine (e.g., computer) readable storage medium, that when executed by a machine will cause the machine to perform the operations described. A tangible machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.). Additionally, the processes can be embodied within hardware, such as an application specific integrated circuit ("ASIC") or otherwise.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A tiled multi-panel display comprising:
   a first display panel including:
      a first substrate with a main portion having a first main thickness, an abutting edge with an thickness less than the first main thickness, and a first taper surface extending between the main portion and the abutting edge, and
      an array of display pixels disposed in the main portion and extending at least partially around the first taper surface;
   a second display panel including:
      a second substrate with a main portion having a second main thickness, an abutting edge with a thickness less than the second main thickness, and a second taper surface extending between the main portion and the abutting edge, and
      an array of display pixels disposed in the main portion and extending partially around the second taper surface,
      wherein the abutting edge of the first display panel abuts the abutting edge of the second display panel to form a seam; and
   a seam-concealing optical element disposed in a void formed by the first and second taper surfaces, wherein the edge-concealing optical element bends light emitted from the display pixels that extend at least partially around the first and second taper surfaces such that a display pixel pitch remains substantially constant across the first and second arrays of display pixels, including across the seam.

2. The display of claim 1 wherein the seam-concealing optical element comprises:
   first and second mating surfaces joined at an apex, the shape of the first mating surface substantially matching the shape of the first taper surface and the shape of the second mating surface substantially matching the shape of the second taper surface; and
   a substantially flat surface coupled to the first and second mating surfaces.

3. The display of claim 2 wherein the seam-concealing optical element comprises a monolithic optically transparent material.

4. The display of claim 2 wherein the seam-concealing optical element comprises an optically transparent material having therein a refractive index gradient.

5. The display of claim 4 wherein the refractive index is highest at the mating surfaces and lowest at the substantially flat surface.

6. The display of claim 2 wherein the seam-concealing optical element comprises a plurality of waveguides embedded in a matrix, each waveguide optically coupled to a pixel from the pixel array and extending from one of the mating surfaces to the substantially flat surface.

7. The display of claim 6 wherein the waveguides are optical fibers.

8. The display of claim 2 wherein the edge-concealing optical element includes a plurality of diffractive, refractive, or reflective elements formed in or on the mating surfaces, the substantially flat surface, or both the mating surfaces and the substantially flat surface.

9. The display of claim 2 wherein the edge-concealing optical element is rigid.

10. A tiled multi-panel display comprising:
   a first display panel including a first substrate with an abutting edge, the first display panel including an array of display pixels disposed therein;

a second display panel including a second substrate with an abutting edge, the second display panel including an array of display pixels disposed therein, wherein the abutting edge of the first display panel abuts the abutting edge of the second display panel to form a seam; and a seam-concealing optical element positioned on the first and second display panels straddling the seam and extending over portions of the first and second arrays of display pixels, wherein the seam-concealing optical element bends light emitted from the portions of the first and second arrays of display pixels such that the apparent pixel pitch of an image displayed by the tiled multi-panel display remains substantially constant across the first and second arrays of display pixels and across the seam;

wherein the seam-concealing optical element comprises a substantially flat mating surface and a curved surface coupled to the mating surface, wherein the seam-concealing optical element comprises an optically transparent material having therein a refractive index gradient with the refractive index being higher at the mating surface and lower at the curved surface.

11. The display of claim 10 wherein the seam-concealing optical element comprises a monolithic optically transparent material.

12. The display of claim 10 wherein the seam-concealing optical element comprises a plurality of waveguides embedded in a matrix, each waveguide optically coupled to a pixel from the pixel array and extending from the mating surface to the curved surface.

13. The display of claim 12 wherein the waveguides are optical fibers.

14. The display of claim 10 wherein the edge-concealing optical element includes a plurality of diffractive, refractive, or reflective elements formed in or on the mating surface, the curved surface, or both the mating surface and the curved surface.

15. The display of claim 10 wherein the seam-concealing optical element is rigid.

16. The display of claim 10 wherein a pixel pitch of pixels over which the seam-concealing optical element extends is less than the pixel pitch of pixels over which the seam-concealing optical element does not extend.

17. The display of claim 10, further comprising a planarization layer positioned over the first display panel, the second display panel, and the seam-concealing optical element to form a tiled multi-panel display with a substantially flat surface.

18. A display panel for use in a tiled multi-panel display, the display panel comprising:

a substrate with an abutting edge, the display panel including an array of display pixels disposed therein; and a seam-concealing optical element positioned on or near the abutting edge and over a portion of the array of display pixels, wherein the seam-concealing optical element bends light emitted from the portions of the array of display pixels such that the apparent pixel pitch of an image displayed by the display panel remains substantially constant;

wherein the substrate includes a main portion having a main thickness, the abutting edge has a thickness less than the main thickness, and a taper surface extends between the main portion and the abutting edge, and wherein the array of display pixels is disposed in the main portion and extends at least partially around the taper surface.

19. The display panel of claim 18, further comprising an additional display panel including a substrate, an abutting edge, and an array of display pixels disposed therein, wherein the abutting edge of the display panel abuts the abutting edge of the additional display panel to form a seam, and wherein the seam-concealing optical element is positioned on the display panel and the additional display panel straddling the seam and extending over portions of the arrays of display pixels, wherein the seam-concealing optical element bends light emitted from the portions of the arrays of display pixels such that the apparent pixel pitch of an image displayed by the tiled multi-panel display remains substantially constant across the first and second arrays of display pixels and across the seam.

20. The display panel of claim 18, further comprising:

an additional display panel having a main thickness, an abutting edge with a thickness less than the main thickness, a taper surface that extends between the main portion and the abutting edge, and an array of display pixels that is disposed in the main portion and at least partially on the taper surface, wherein the abutting edge of the display panel abuts the abutting edge of the additional display panel to form a seam;

wherein the seam-concealing optical element is positioned on the taper surfaces, wherein the seam-concealing optical element bends light emitted from display pixels such that the apparent pixel pitch of an image displayed by the tiled multi-panel display remains substantially constant across the first and second arrays of display pixels and across the seam.

\* \* \* \* \*